(12) United States Patent
Choi et al.

(10) Patent No.: US 9,690,146 B2
(45) Date of Patent: Jun. 27, 2017

(54) ARRAY SUBSTRATE, ITS MANUFACTURING METHOD, AND DISPLAY DEVICE

(71) Applicant: BOE TECHNOLOGY GROUP CO., LTD., Beijing (CN)

(72) Inventors: Seungjin Choi, Beijing (CN); Heecheol Kim, Beijing (CN); Youngsuk Song, Beijing (CN); Seongyeol Yoo, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 238 days.

(21) Appl. No.: 14/388,699

(22) PCT Filed: Dec. 18, 2013

(86) PCT No.: PCT/CN2013/089765
§ 371 (c)(1),
(2) Date: Sep. 26, 2014

(87) PCT Pub. No.: WO2015/021720
PCT Pub. Date: Feb. 19, 2015

(65) Prior Publication Data
US 2016/0282679 A1 Sep. 29, 2016

(30) Foreign Application Priority Data

Aug. 12, 2013 (CN) .......................... 2013 1 0349727

(51) Int. Cl.
*H01L 27/12* (2006.01)
*G02F 1/1343* (2006.01)
(Continued)

(52) U.S. Cl.
CPC ...... *G02F 1/134309* (2013.01); *G02F 1/1368* (2013.01); *G02F 1/136286* (2013.01);
(Continued)

(58) Field of Classification Search
CPC ............. H01L 27/1248; H01L 27/1259; G02F 1/136209; G02F 1/134309
(Continued)

(56) References Cited

U.S. PATENT DOCUMENTS 8,064,002 B2 * 11/2011 Kim .................. G02F 1/133528
349/40
2002/0085156 A1 7/2002 Lee
(Continued)

FOREIGN PATENT DOCUMENTS

CN 1420554 5/2003
CN 102723308 A 10/2012
(Continued)

OTHER PUBLICATIONS

Written Opinion in International Application No. PCT/CN2013/089765, dated Jun. 3, 2014.
(Continued)

*Primary Examiner* — Moazzam Hossain
(74) *Attorney, Agent, or Firm* — Brooks Kushman P.C.

(57) ABSTRACT

An embodiment of the present invention provides an array substrate, its manufacturing method and a display device. The method for manufacturing the array substrate comprises forming a common electrode with a slit structure on a substrate, and a pixel electrode with a slit structure not overlapping the common electrode. According to the present invention, it is able to reduce storage capacitance between the common electrode and the pixel electrode, thereby to ensure the image quality.

9 Claims, 2 Drawing Sheets

(51) Int. Cl.
*H01L 21/77* (2017.01)
*H01L 29/78* (2006.01)
*G02F 1/1362* (2006.01)
*G02F 1/1368* (2006.01)

(52) U.S. Cl.
CPC ........ *H01L 27/124* (2013.01); *H01L 27/1248* (2013.01); *H01L 27/1288* (2013.01); *G02F 2001/13685* (2013.01); *G02F 2001/134372* (2013.01)

(58) Field of Classification Search
USPC .......................................................... 257/72
See application file for complete search history.

(56) References Cited

U.S. PATENT DOCUMENTS

| | | | | |
|---|---|---|---|---|
| 2009/0251628 | A1* | 10/2009 | Lin | H01L 27/124 349/39 |
| 2010/0091228 | A1* | 4/2010 | Kim | G02F 1/13731 349/122 |
| 2013/0050805 | A1* | 2/2013 | Kim | G02F 1/167 359/296 |
| 2013/0329168 | A1* | 12/2013 | Chung | G02F 1/134336 349/96 |
| 2013/0335648 | A1* | 12/2013 | Kuroda | H04N 13/0497 349/15 |
| 2015/0029430 | A1* | 1/2015 | Song | G02F 1/133707 349/43 |
| 2016/0035893 | A1* | 2/2016 | Kao | H01L 29/7869 257/43 |
| 2016/0377895 | A1* | 12/2016 | Liu | H01L 21/77 257/43 |

FOREIGN PATENT DOCUMENTS

| | | |
|---|---|---|
| CN | 102830560 | 12/2012 |
| CN | 202735644 | 2/2013 |
| CN | 103413784 A | 11/2013 |
| CN | 203365867 | 12/2013 |
| JP | 2010-170123 A | 8/2010 |

OTHER PUBLICATIONS

P.R. China, First Office Action, App. No. 201310349727.6, Nov. 3, 2014.

* cited by examiner

ARRAY SUBSTRATE, ITS MANUFACTURING METHOD, AND DISPLAY DEVICE

CROSS-REFERENCE TO RELATED APPLICATION

This application is the U.S. national phase of PCT Application No. PCT/CN2013/089765 filed on Dec. 18, 2013, which claims priority to Chinese Patent Application No. 201310349727.6 filed on Aug. 12, 2013, the disclosures of which are incorporated in their entirety by reference herein.

TECHNICAL FIELD

The present invention relates to the field of display technology, in particular to an array substrate, its manufacturing method and a display device.

BACKGROUND

Thin film transistor-liquid crystal display (TFT-LCD) uses a change of electric field strength on a liquid crystal layer to change a degree of rotation of liquid crystal molecules and control the light intensity, thereby to display an image. Generally, a complete liquid crystal panel must comprise a backlight module, a polarizer, an upper substrate (usually a color film substrate), a lower substrate (usually an array substrate), and a liquid crystal molecules layer arranged in a cell formed by the two substrates.

Crisscross data lines and gate lines are formed on the array substrate, and pixel units arranged in a matrix form are formed by the data lines and gate lines. Each pixel unit includes a TFT switch and a pixel electrode. The TFT switch includes a gate electrode, a source electrode, a drain electrode and an active layer. The gate electrode is connected to the gate line, the source electrode is connected to the data line, the drain electrode is connected to the pixel electrode, and the active layer is arranged between the source/drain electrode and the gate electrode.

Usually, a common electrode is further formed on the array substrate and configured to form an electric field with the pixel electrode. The degree of rotation of the liquid crystal molecules depends on the change of electric field strength between the common electrode and the pixel electrode.

For Advanced super dimension switch (ADS-DS, ADS for short), it refers to the formation of a multi-dimensional electric field through electric fields generated at edges of slit electrodes in an identical plane and an electric field generated between a slit electrode layer and a plate electrode layer, so as to rotate all orientational liquid crystal molecules between the slit electrodes and right above the electrodes in a liquid crystal cell, thereby to improve the working efficiency of the liquid crystal molecules and increase the light transmittance. A TFT-LCD product using the ADS technology can provide excellent image quality, and meanwhile has such advantages as a high resolution, high light transmittance, low power consumption, a wide view angle, a high aperture ratio, low chromatic aberration, and no push Mura.

As shown in FIG. 1, storage capacitance (Cst) between a common electrode 11 and a pixel electrode 112 in a TFT array substrate 110 in an ADS mode is very large, the storage capacitor almost occupies the entire pixel region. Especially for a large-scale product, when an area of the pixel region becomes bigger, the storage capacitance is much larger. Usually, in order to fit to such large storage capacitance, it is required to design a bigger TFT to fill therein. However, such a TFT occupies the pixel region, and coupling capacitance Cgd, Cgs of the TFT itself also become larger, so the image display is adversely affected and the design thereof is limited. Generally, one of the most direct ways to solve this problem is to form the ADS-type pixel electrode 112 and the common electrode 111 in the state as shown in FIG. 2. However, such a structure cannot be directly implemented by an existing process. This is because both the pixel electrode 112 and the common electrode 111 are transparent, and during the exposing and developing procedures using a device, an alignment effect of transparent films is limited, i.e., it is impossible to use the device to obtain the real structure as shown in FIG. 2. If the relative displacement of the pixel electrode and the common electrode is uneven within an active display region due to the alignment deviation, e.g., if the pixel electrode 112 at some region is offset to the left relative to the common electrode 111 while the pixel electrode 112 at another region is offset to the right relative to the common electrode 111, there is unequal gaps between Cst regions. As a result, in an image, uneven display grayscale occurs among the regions of the display device, and a distorted image is seen by eyes due to the uneven display brightness between the regions. This is a serious display defect, but there is no perfect solution for this in the prior art.

SUMMARY

An object of an embodiment of the present invention is to provide an array substrate, its manufacturing method, and a display device, so as to ensure no overlap between a pixel electrode and a common electrode of the array substrate, thereby to reduce storage capacitance between the common electrode and the pixel electrode and ensure the image quality.

In one aspect, an embodiment of the present invention provides a method for manufacturing an array substrate, including a step of:

forming, on a substrate, a common electrode with a slit structure, and a pixel electrode with a slit structure not overlapping the common electrode.

The step of forming, on the substrate, the common electrode with the slit structure, and the pixel electrode with the slit structure not overlapping the common electrode includes:

forming a gate electrode, a gate line, a gate insulating layer, a semiconductor layer, a data line and a source/drain electrode on the substrate;

forming patterns of a protective layer and a passivation layer with slit structures on the substrate formed with the gate electrode, the gate line, the gate insulating layer, the semiconductor layer, the data line and the source/drain electrode; and forming a transparent conductive film on the substrate formed with the patterns of the protective layer and the passivation layer, the transparent conductive film being used to form the common electrode with the slit structure located on the protective layer and the pixel electrode located at a slit region in the slit structures of the protective layer and the passivation layer, the pixel electrode being directly lapped onto the drain electrode.

The step of forming the patterns of the protective layer and the passivation layer with slit structures on the substrate formed with the gate electrode, the gate line, the gate insulating layer, the semiconductor layer, the data line and the source/drain electrode includes:

forming the passivation layer;

forming the protective layer on the passivation layer; and patterning the protective layer and the passivation layer, so as to obtain the patterns of the protective layer and the passivation layer with the slit structures.

The step of patterning the protective layer and the passivation layer, so as to obtain the patterns of the protective layer and the passivation layer with the slit structures includes:

forming a photoresist on the protective layer, and etching the protective layer and the passivation layer sequentially by a common patterning process, so as to obtain the patterns of the protective layer and the passivation layer with the slit structures.

The step of patterning the protective layer and the passivation layer, so as to obtain the patterns of the protective layer and the passivation layer with the slit structures includes:

forming the protective layer with the slit structure by an exposing and developing process; and directly etching the passivation layer exposed by the slit structure, so as to obtain the patterns of the protective layer and the passivation layer with the slit structures.

The step of forming, on the substrate, the common electrode with the slit structure and the pixel electrode with the slit structure not overlapping the common electrode includes:

forming patterns of the semiconductor layer, the source/drain electrode and the data line sequentially on the substrate;

forming a pattern of a gate insulating layer film and patterns of the gate electrode and the gate line sequentially on the substrate formed with the patterns of the semiconductor layer, the source/drain electrode and the data line;

forming the protective layer on the substrate formed with the pattern of the gate insulating layer film and the patterns of the gate electrode and the gate line;

patterning the protective layer and the gate insulating layer film by a patterning process, so as to form patterns of the protective layer and the gate insulating layer with slit structures; and forming the transparent conductive film on the substrate formed with the patterns of the protective layer and the gate insulating layer, the transparent conductive film being used to form the common electrode with the slit structure located on the protective layer and the pixel electrode located at the slit region in the slit structures of the protective layer and the gate insulating layer, the pixel electrode being directly lapped onto the drain electrode.

Subsequent to forming the transparent conductive film, the method further includes:

removing the transparent conductive film above the semiconductor layer and the source/drain electrode by a patterning process, so as to obtain the final patterns of the common electrode and the pixel electrode.

In another aspect, an embodiment of the present invention provides an array substrate, including:

a substrate; and a common electrode with a slit structure and a pixel electrode with a slit structure not overlapping the common electrode formed on the substrate.

The array substrate includes a bottom gate TFT or a top gate TFT.

The bottom gate TFT includes a gate electrode, a gate line and a gate insulating layer formed on the substrate, as well as a semiconductor layer, a data line and a source/drain electrode formed on the gate insulating layer.

Patterns of a protective layer and a passivation layer with slit structures are formed above the semiconductor layer and the source/drain electrode on the substrate, and the protective layer and the passivation layer are formed as a laminated structure.

In the laminated structure of the protective layer and the passivation layer, the protective layer has a cross section wider than the passivation layer.

The top gate TFT includes the semiconductor layer, the data line and the source/drain electrode formed on the substrate, and the gate insulating layer film, the gate electrode and the gate line sequently formed on the source/drain electrode and the data line.

The protective layer is formed on the gate electrode and the gate line on the substrate, the protective layer and the gate insulating layer film are patterned by a patterning process so as to form the patterns of the protective layer and the gate insulating layer with the slit structures, and the protective layer and the gate insulating layer are formed as a laminated structure.

The common electrode with the slit structure is formed on the pattern of the protective layer, the pixel electrode with the slit structure is formed at a slit region in the slit structures of the protective layer and the passivation layer, and the pixel electrode is directly lapped onto the drain electrode.

The common electrode with the slit structure is formed on the pattern of the protective layer, the pixel electrode with the slit structure is formed at a slit region in the slit structures of the protective layer and the gate insulating layer, and the pixel electrode is directly lapped onto the drain electrode.

The protective layer is made of an inorganic insulating resin material or an organic photosensitive resin material.

In yet another aspect, an embodiment of the present invention provides a display device including the above-mentioned array substrate.

According to the present invention, the common electrode with the slit structure and the pixel electrode with the slit structure not overlapping the common electrode are formed on the substrate. As a result, it is able to reduce the storage capacitance between the common electrode and the pixel electrode, thereby to ensure the image quality.

DETAILED DESCRIPTION

In order to make the objects, the technical solutions and the advantages of the present invention more apparent, the present invention will be described hereinafter in conjunction with the drawings and the embodiments.

An embodiment of the present invention provides a method for manufacturing an array substrate, includes a step of:

forming, on a substrate, a common electrode with a slit structure, and a pixel electrode with a slit structure not overlapping the common electrode.

Through forming the common electrode with the slit structure and the pixel electrode with the slit structure not overlapping the common electrode on the substrate, it is able to reduce storage capacitance between the common electrode and the pixel electrode, thereby to ensure image quality.

FIGS. 3-8 show the procedures of forming the common electrode with the slit structure and the pixel electrode with the slit structure not overlapping the common electrode on the substrate.

Figure 1:
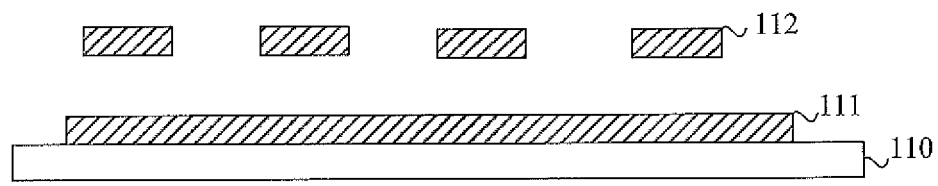
FIG. 1 is a schematic view showing a common electrode and a pixel electrode on an existing array substrate.
Figure 2:
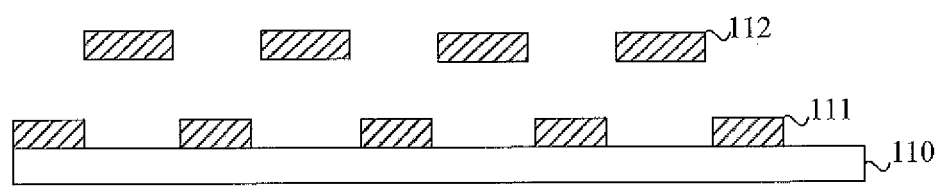
FIG. 2 is a schematic view showing a pixel electrode with a slit structure and a common electrode with a slit structure in an array substrate.
Figure 3:
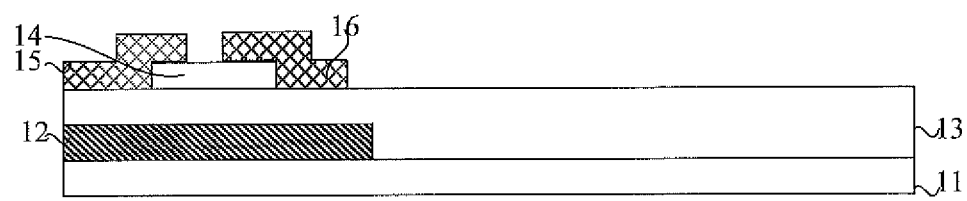
FIGS. 3-8 are schematic views showing a method for manufacturing an array substrate according to an embodiment of the present invention.

As shown in FIG. 3, the method includes providing a substrate 11, and forming a gate electrode 12, a gate line (not shown), a gate insulating layer 13, a semiconductor layer 14, a data line (not shown), a source electrode 15 and a drain electrode 16 on the substrate 11. To be specific, this step may include:

Step 31: forming a gate metal layer on the substrate, and forming patterns of the gate line and the gate electrode by a patterning process;

Step 32: forming the gate insulating layer on the substrate formed with the patterns of the gate line and the gate electrode;

Step 33: forming a semiconductor layer film on the gate insulating layer, and forming a pattern of the semiconductor layer by a patterning process; and Step 34: forming a source/drain metal layer film on the semiconductor layer, and forming patterns of the source electrode, the drain electrode and the data line by a patterning process.

The semiconductor layer and the source/drain electrode may be formed by:

Step 34': forming the semiconductor layer film and the source/drain metal layer film sequentially on the substrate formed with the gate insulating layer, and processing the source/drain metal layer film and the semiconductor layer film by a patterning process, so as to obtain patterns of a semiconductor active layer 14, the data line (not shown), the source electrode 15, and the drain electrode 16.

Step 34' may include:

Step 341: coating a photoresist onto the source/drain metal layer film;

Step 342: exposing and developing the photoresist with a half-tone mask plate or a gray-tone mask plate, so as to form a photoresist fully-reserved region corresponding to a region of the source electrode, a region of the source electrode and a region of the data line, a photoresist partially-reserved region corresponding to a gap region between the source electrode and the drain electrode, and a photoresist fully-removed region corresponding to the other regions;

Step 343: removing the source/drain metal layer film and the semiconductor layer film at the photoresist fully-removed region by an etching process, so as to expose the gate insulating layer at this region;

Step 344: removing the photoresist at the photoresist partially-reserved region by a plasma ashing process, so as to expose the source/drain metal layer film at this region;

Step 345: etching the exposed source/drain metal layer film by an etching process, so as to expose the semiconductor layer and form a pattern of the gap region between the source electrode and the drain electrode of the TFT at this region; and Step 346: removing the photoresist at the photoresist fully-reserved region by a plasma ashing process or a photoresist peeling off process, so as to form the patterns of the data line, the source electrode, the drain electrode, and a gap between the source electrode and the drain electrode.

The above steps are merely the specific ones, and the method of this embodiment is not limited thereto. It should be appreciated that, in different modes, e.g., in a top gate mode or a bottom gate mode, the patterns may be formed differently. For example, the structure of the TFT on the array substrate may be achieved by adjusting the order of the steps, or adjusting the order of the mask processes. FIG. 3 merely shows a bottom gate structure, which includes the gate electrode 12, the gate line (not shown), the gate insulating layer 13, the semiconductor layer 14, the data line (not shown), the source electrode 15 and the drain electrode 16.

Figure 4:
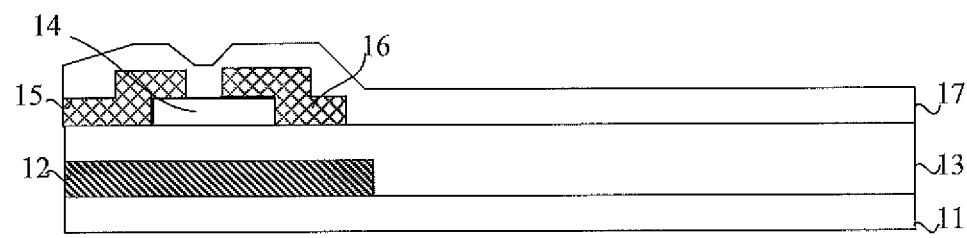

As shown in FIG. 4, a passivation layer 17 is formed on the substrate formed with the gate electrode 12, the gate line (not shown), the gate insulating layer 13, the semiconductor layer 14, the data line (not shown), the source electrode 15 and the drain electrode 16.

Figure 5:
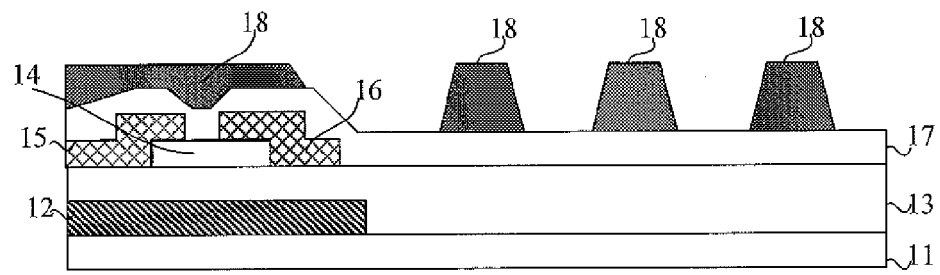

As shown in FIG. 5, a pattern of a protective layer 18 with a slit structure is formed on the substrate 11 formed with the passivation layer 17. The pattern of the protective layer with the slit structure may be formed by the following steps.

Step 51: forming the protective layer on the passivation layer. The protective layer may be made of a resin material, alternatively an inorganic insulating resin material.

The inorganic insulating resin material has a film-forming density higher than the passivation layer 17, so that the protective layer may be etched at a rate lower than the passivation layer in a subsequent patterning process. As a result, it is able to ensure the occurrence of an etching chamfer between the passivation layer and the protective layer on a cross section.

Further, the protective layer 18 may also be made of a photosensitive resin material, so as not to etch the protective layer subsequently.

Step 52: patterning the protective layer and passivation layer so as to obtain the patterns of the protective layer and the passivation layer with the slit structures as shown in FIG. 5.

A slit region in the slit structure corresponds to a region of the pixel electrode, and the protective layer in the slit structure corresponds to a region of the common electrode.

Step 52 may be performed in the following two modes.

Figure 6:
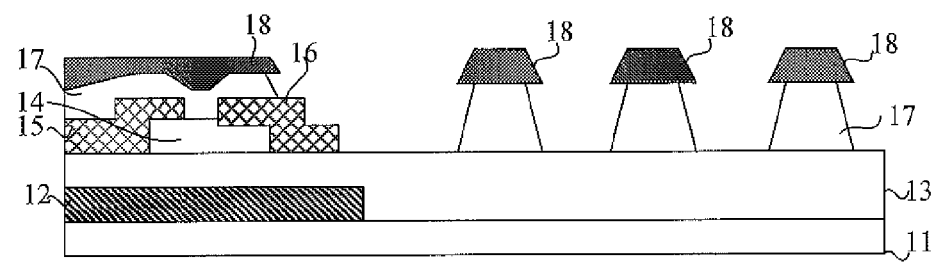

Mode 1: forming the photoresist on the protective layer, and etching the protective layer 18 and the passivation layer 17 sequentially by a common patterning process so as to form a slit pattern as shown in FIG. 6. In order to ensure separation between the pixel electrode and the common electrode subsequently, usually an etchant that can etch the passivation layer and the protective layer at different rates may be selected, so as to ensure that the passivation layer is etched at a rate higher than the protective layer, thereby to form an etching chamber at a contact position of the passivation layer and the protective layer. In other words, the protective layer has a cross section wider than the passivation layer at a region where the passivation layer overlaps the protective layer.

Mode 2: when the protective layer is made of an organic photosensitive resin material, forming a slit structure of the protective layer by an exposing and developing process, directly etching the exposed passivation layer using the pattern of the protective layer, and controlling an etching time or an etching rate by an etching process so as to obtain the patterns of the protective layer and the passivation layer with the slit structures as shown in FIG. 6. In a laminated structure of the passivation layer and the protective layer, the passivation layer has a cross section narrower than the protective layer, so as to generate a well offset when forming the pixel electrode and the common electrode subsequently, thereby to ensure separation between the pixel electrode and the common electrode.

The above steps are merely the specific ones, but the method of this embodiment is not limited thereto. It should be appreciated that, the patterns may be formed differently under different modes. For example, the patterns of the protective layer and the passivation layer with the slit structures may be formed by adjusting the order of the steps or combining the etching steps.

Further, for example, when the TFT is of a top gate structure, the patterns of the semiconductor layer, the source/drain electrode and the data line may be formed sequentially on the array substrate. The gate insulating layer film and the patterns of the gate electrode and the gate line may be formed sequentially on the substrate formed with the source/drain electrode and the data line. The protective layer may be formed on the pattern of the gate electrode and the gate line, and the protective layer and the gate insulating layer film are patterned by a patterning process so as to form the protective layer and the gate insulating layer with the slit structures (in this top gate structure, the passivation layer is formed by the gate insulating layer). The slit in the slit structure corresponds to the region of the pixel electrode, and the pattern of the protective layer in the slit structure corresponds to the pattern of the common electrode.

Figure 7:
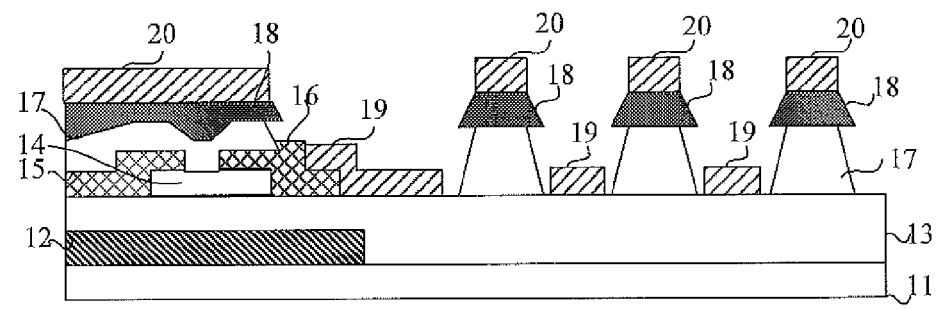

As shown in FIG. 7, a transparent conductive film is formed on the substrate formed with the patterns of the protective layer and the passivation layer, the transparent conductive film is used to obtain the common electrode 20 located on the protective layer and the pixel electrode 19 located at the slit region in the slit structure by a single film-forming process. A bottom of the pattern of the protective layer covers a top of the passivation layer and an etching chamber is formed between the passivation layer and the protective layer, i.e., the protective layer has a cross section wider than the passivation layer, so the common electrode 20 located on the protective layer does not overlap the pixel electrode 19 located at the slit region of the slit structure when forming the transparent conductive film, and the electrodes are arranged in a staggered manner in horizontal positions. Due to the non-overlap between the common electrode and the pixel electrode, it is able to minimize the storage capacitance, thereby to ensure the image quality.

As compared with a traditional process where the pixel electrode and the common electrode are manufactured separately, in this embodiment, it is able to reduce the manufacturing steps, shorten the manufacturing procedure, and improve the efficiency of manufacturing the array substrate.

Figure 8:
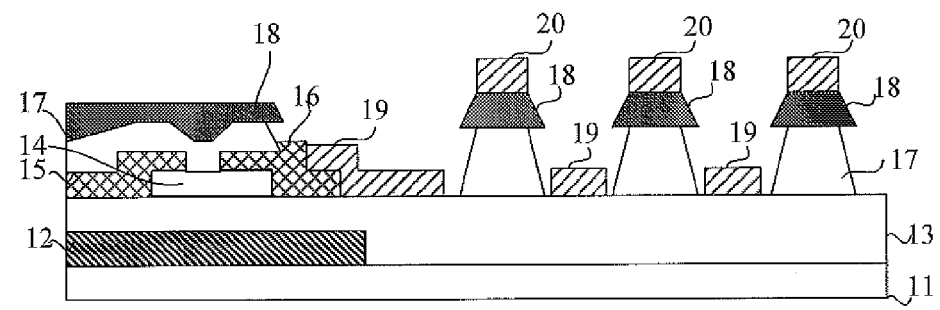

As shown in FIG. 8, subsequent to forming the pixel electrode and the common electrode, the method may further include removing the transparent conductive film above the TFT (the semiconductor layer, the source electrode and the drain electrode) by a patterning process, so as to obtain the final patterns of the common electrode and the pixel electrode. In this case, the transparent conductive film above the semiconductor layer is a part of the common electrode, and it is located above the TFT. Signal interference will be caused if the transparent conductive film is located above the TFT, thereby the load of the TFT will be increased. In addition, undesired parasitic capacitance will be generated, e.g., the Cdc will be increased. As a result, by removing the transparent conductive film, it is able to minimize the adverse effect on the TFT.

Based on the above, the method of this embodiment may be applied to the TFT array substrate in an ADS mode. Metal layers of the common electrode and the pixel electrode are formed by a single film-forming process, and the common electrode and the pixel electrode with the slit structures are formed so that there is no overlap between the common electrode and the pixel electrode. As a result, it is able to avoid the storage capacitance between the common electrode and the pixel electrode, thereby to ensure the image quality.

As compared with a traditional process where the pixel electrode and the common electrode are manufactured separately, in this embodiment, it is able to reduce the manufacturing steps, shorten the manufacturing procedure, and improve the efficiency of manufacturing the array substrate.

In addition, as shown in FIG. 8, an embodiment of the present invention further provides an array substrate manufactured by the above method. The array substrate includes the substrate 11, the common electrode 20 with the slit structure formed on the substrate and the pixel electrode 19 with the slit structure not overlapping the common electrode 20.

The array substrate includes a bottom gate TFT or a top gate TFT.

The bottom gate TFT includes the gate electrode 12, the gate line and the gate insulating layer 13 formed on the substrate 11, as well as the semiconductor layer 14, the data line, the source electrode 15 and the drain electrode 16 formed on the gate insulating layer 13. On the substrate 11, the patterns of the protective layer and the passivation layer with the slit structures are formed above the semiconductor layer 14, the source electrode 15 and the drain electrode 16.

The top gate TFT includes the semiconductor layer, the data line and the source/drain electrode formed on the substrate, and the gate insulating layer, the gate electrode and the gate line sequentially formed on the source/drain electrode and the data line.

On the substrate, the protective layer is formed on the gate electrode and the gate line, the protective layer and the gate insulating layer are patterned by a patterning process so as to form the patterns of the protective layer and the gate insulating layer with the slit structures. The protective layer and the gate insulating layer are formed as a laminated structure.

As shown in FIG. 8, in the laminates structure of the protective layer and the passivation layer, the protective layer has a cross section wider than the passivation layer, so that the transparent conductive film can be used to form the common electrode 20 located above the protective layer and the pixel electrode 10 located at the slit region by a single depositing process. Moreover, the steps of etching the common electrode and the pixel electrode may be omitted. In addition, the bottom of the pattern of the protective layer covers the top of the passivation layer, so the common electrode located on the protective layer will not overlap the pixel electrode 19 located on the gate insulating layer when depositing the transparent conductive film. As a result, it is able to avoid the storage capacitance between the common electrode and the pixel electrode, thereby to ensure the image quality.

In the top gate structure, the passivation layer of the slit structure is formed by the gate insulating layer, and the gate electrode is located between the gate insulating layer and the protective layer. In the laminated structure of the protective layer and the gate insulating layer, the protective layer has a cross section wider than the gate insulating layer. Also, the transparent conductive film may be used to form the common electrode 20 located above the protective layer and the pixel electrode located at the slit region by a single film-forming process. Moreover, the steps of etching the common electrode and patterning the pixel electrode may be omitted. In addition, the bottom of the pattern of the protective layer covers the top of the gate insulating layer, so the common electrode 20 located on the protective layer will not overlap the pixel electrode 19 located on the gate insulating layer when depositing the transparent conductive film. As a result, it is able to avoid the storage capacitance between the common electrode and the pixel electrode, thereby to ensure the image quality.

In the above embodiment, the pixel electrode is directly lapped onto the drain electrode, regardless of in the bottom gate structure or the top gate structure. The common electrode 20 with the slit structure is located on the pattern of the protective layer, and the pixel electrode 19 with the slit structure is formed at the slit region in the slit structure. In other words, the passivation layer (or the gate insulating layer) and the protective layer are formed between the pixel electrode and the common electrode. In addition, when manufacturing the common electrode and the pixel electrode, the transparent conductive film may be used to form the common electrode 20 located above the protective layer and the pixel electrode 19 located at the slit region by a single depositing process. Moreover, the steps of etching the common electrode and the pixel electrode may be omitted. Furthermore, the bottom of the pattern of the protective layer covers the top of the passivation layer (or the gate insulating layer), so the common electrode 20 located on the protective layer will not overlap the pixel electrode 19 located at the slit region when depositing the transparent conductive film. As a result, it is able to avoid the storage capacitance between the common electrode and the pixel electrode, thereby to ensure the image quality.

In this embodiment, the protective layer may be made of an organic photosensitive resin material or an inorganic insulating resin material. The common electrode 20 and the pixel electrode 19 may be made of an identical metallic material. Also, the pixel electrode and the common electrode with the slit structures are formed in such a way that there is no overlap therebetween. As a result, it is able to avoid the storage capacitance between the common electrode and the pixel electrode, thereby to ensure the image quality.

In the embodiments of the present invention, any known film-forming processes may be used, such as chemical vapor deposition (CVD), evaporation and magnetron sputtering. In addition, the photoresist may be applied by spinning, praying or transferring. These film-forming processes or photoresist applying processes may be selected freely by a person skilled in the art in accordance with the device or product design.

An embodiment of the present invention further provides a display device including the above-mentioned array substrate. The display device may be any product or element having a display function, such as a liquid crystal panel, an electronic paper, an OLED panel, a mobile phone, a flat panel PC, a TV, a display, a laptop PC, a digital photo frame and a navigator.

The above are merely the preferred embodiments of the present invention. It should be appreciated that, a person skilled in the art may make further modifications and improvements without departing from the principle of the present invention, and these modifications and improvements shall also be included in the scope of the present invention.

What is claimed is:

1. A method for manufacturing an array substrate, comprising a step of:
   forming, on a substrate, a common electrode with a slit structure, and a pixel electrode with a slit structure not overlapping the common electrode,
   wherein the step of forming, on the substrate, the common electrode with the slit structure, and the pixel electrode with the slit structure not overlapping the common electrode comprises:
   forming a gate electrode, a gate insulating layer, a semiconductor layer and a source/drain electrode on the substrate;
   forming patterns of a protective layer and a passivation layer with slit structures on the substrate formed with the gate electrode, the gate insulating layer, the semiconductor layer and the source/drain electrode; and
   forming a transparent conductive film on the substrate formed with the patterns of the protective layer and the passivation layer, the transparent conductive film being used to form the common electrode with the slit structure located on the protective layer and the pixel electrode located at a slit region in the slit structures of the protective layer and the passivation layer, the pixel electrode being directly lapped onto the drain electrode.

2. The method according to claim 1, wherein the step of forming the patterns of the protective layer and the passivation layer with slit structures on the substrate formed with the gate electrode, the gate insulating layer, the semiconductor layer and the source/drain electrode comprises:
   forming the passivation layer;
   forming the protective layer on the passivation layer; and
   patterning the protective layer and the passivation layer, so as to obtain the patterns of the protective layer and the passivation layer with the slit structures.

3. The method according to claim 2, wherein the step of patterning the protective layer and the passivation layer, so as to obtain the patterns of the protective layer and the passivation layer with the slit structures comprises:
   forming a photoresist on the protective layer; and
   etching the protective layer and the passivation layer sequentially by a common patterning process, so as to obtain the patterns of the protective layer and the passivation layer with the slit structures.

4. The method according to claim 3, wherein the protective layer is made of an inorganic insulating resin material.

5. The method according to claim 2, wherein the step of patterning the protective layer and the passivation layer, so as to obtain the patterns of the protective layer and the passivation layer with the slit structures comprises:
   forming the protective layer with the slit structure by an exposing and developing process; and
   directly etching the passivation layer exposed by the slit structure, so as to obtain the patterns of the protective layer and the passivation layer with the slit structures.

6. The method according to claim 5, wherein the protective layer is made of an organic photosensitive resin material.

7. A method for manufacturing an array substrate, comprising a step of:
   forming, on a substrate, a common electrode with a slit structure, and a pixel electrode with a slit structure not overlapping the common electrode,
   wherein the step of forming, on the substrate, the common electrode with the slit structure and the pixel electrode with the slit structure not overlapping the common electrode comprises:
   forming patterns of the semiconductor layer and the source/drain electrode sequentially on the substrate;
   forming a pattern of a gate insulating layer film and a patterns of the gate electrode sequentially on the substrate formed with the patterns of the semiconductor layer and the source/drain electrode;

forming the protective layer on the substrate formed with the pattern of the gate insulating layer film and the patterns of the gate electrode;

patterning the protective layer and the gate insulating layer film by a patterning process, so as to form patterns of the protective layer and the gate insulating layer with slit structures; and forming the transparent conductive film on the substrate formed with the patterns of the protective layer and the gate insulating layer, the transparent conductive film being used to form the common electrode with the slit structure located on the protective layer and the pixel electrode located at the slit region in the slit structures of the protective layer and the gate insulating layer, the pixel electrode being directly lapped onto the drain electrode.

8. The method according to claim 1, wherein subsequent to forming the transparent conductive film, the method further comprises:

removing the transparent conductive film above the semiconductor layer and the source/drain electrode by a patterning process, so as to obtain the final patterns of the common electrode and the pixel electrode.

9. The method according to claim 7, wherein subsequent to forming the transparent conductive film, the method further comprises:

removing the transparent conductive film above the semiconductor layer and the source/drain electrode by a patterning process, so as to obtain the final patterns of the common electrode and the pixel electrode.

* * * * *